United States Patent [19]

McCune

[11] Patent Number: 5,376,625
[45] Date of Patent: Dec. 27, 1994

[54] METHOD OF MAKING THIN FILM SUPERCONDUCTOR ASSEMBLY

[75] Inventor: Robert C. McCune, Birmingham, Mich.

[73] Assignee: Ford Motor Company, Dearborn, Mich.

[21] Appl. No.: 839,465

[22] Filed: Feb. 20, 1992

Related U.S. Application Data

[62] Division of Ser. No. 137,907, Dec. 28, 1987, Pat. No. 5,132,283.

[51] Int. Cl.$^5$ .......................... B05D 3/06; B05D 5/12
[52] U.S. Cl. ................................ 505/473; 505/701; 505/702; 505/704; 505/818; 505/819; 505/821; 505/475; 505/434; 427/62; 427/419.1; 427/419.2; 427/530
[58] Field of Search .................. 505/1, 701, 702, 704, 505/813, 818, 819, 821; 427/62, 63, 419.1, 419.2, 530

[56] References Cited

U.S. PATENT DOCUMENTS

| | | |
|---|---|---|
| 3,327,370 | 6/1967 | Cohen . |
| 3,447,961 | 6/1969 | Hitchcock .............................. 427/63 |
| 3,493,475 | 9/1970 | Neugebauer et al. . |
| 3,514,850 | 6/1970 | Barber et al. . |
| 3,537,827 | 11/1970 | Benz et al. . |
| 3,736,365 | 5/1973 | Bobo et al. . |
| 3,781,982 | 1/1974 | Ziemek et al. . |
| 3,890,700 | 6/1975 | Diepers et al. . |
| 4,341,924 | 7/1982 | Gleim . |
| 4,585,696 | 4/1986 | Dustmann et al. . |
| 4,844,989 | 7/1989 | Murduck et al. .................... 428/698 |
| 4,942,142 | 7/1990 | Itozaki et al. ............................ 505/1 |

OTHER PUBLICATIONS

Garzon et al, "Characterization of Y-Ba-Cu-O Superconducting Thin Films Prepared by Coevaporation of Y, Cu and BaF$_2$", Appl. Phys. Lett. 54(14) Apr. 1989 pp. 1365-1367.

Tanaka et al, "Superconducting Thin Films On Sintered Alumina Substrates", MRS Int'l Mtg. on Adv. Mats. vol. 6, 1989 pp. 845-850.

Woo et al, Physical Review Letters 58, No. 9, pp. 908-910 (2 Mar., 1987).

Kitabatake et al, *Superconducting Y-Ba-Cu-O and Er-Ba-Cu-O Thin Films Prepared by Sputtering Deposition*, 34th National Symposium, American Vacuum Society (6 Nov., 1987). (Abstract only).

Laibowitz, *Vapor Deposited Superconducting Oxide Thin Films*, 34th National Sumposium, American Vacuum Society (6 Nov., 1987). (Abstract only).

Hong et al, *Thin Film Research of High T$_c$ Superconductors*, 34th National Symposium, American Vacuum Society (6 Nov., 1987). (Abstract only).

*Primary Examiner*—Roy V. King
*Attorney, Agent, or Firm*—Lorraine S. Melotik; Roger L. May

[57] ABSTRACT

A thin film superconductor assembly is disclosed along with a method of fabricating same. The assembly comprises a self-supporting substrate defining at least a portion of a containment for a flow of cryogenic fluid, a dielectric layer adherent to a surface of the substrate, a thin film superconductor adherent to the dielectric layer and a moisture and oxygen impervious electrically insulating coating covering the thin film superconductor. A method of forming such thin film superconductor assembly, wherein the dielectric layer consists essentially of aluminum nitride, comprises growing the aluminum nitride dielectric layer integrally on the surface of the substrate.

10 Claims, 1 Drawing Sheet

METHOD OF MAKING THIN FILM SUPERCONDUCTOR ASSEMBLY

This application is a division of application Ser. No. 07/137,907, filed on Dec. 28, 1987, now U.S. Pat. No. 5,132,283.

BACKGROUND OF THE INVENTION

1. Field of the Invention

This invention relates to superconductor assemblies, specifically, superconductor assemblies wherein a thermally conductive structural substrate carries a thin film superconductor and also forms a containment for a flow of cryogenic fluid.

2. Description of the Prior Art

Superconductive articles such as cables for the transmission of electricity are well known. Until recently, most teaching regarding the use of superconductors was directed to materials providing superconductivity at temperatures near absolute zero. Thus, for example, in U.S. Pat. No. 4,585,696 issued Apr. 29, 1986 to Dustmann et al a superconducting fiber is disclosed in which a base layer of silicon carbide is applied to the surface of a carbon fiber core. The base layer, in turn, carries a superconducting layer said to consist of a niobium carbon nitride or a niobium oxycarbonitride. The superconducting layer is covered by a shell of high purity copper or aluminum. In U.S. Pat. No. 4,341,924 issued Jul. 27, 1982 to Gleim is disclosed a superconductive article comprising an electrically normal conductive metal cable having on the outer surface thereof a layer containing cobalt phthalocyanine and an alkaline metal such as lithium, sodium or potassium. The metal cable is said preferably to be aluminum and is hollow at its core. The layer of cobalt phthalocyanine and alkaline metal is deposited by vacuum deposition and is covered by a material impermeable to air and water vapors and having a high dielectric constant, such as polyethylene. Such cable is said to operate as a superconductor in a cryogenic environment such as that of liquid nitrogen or liquid hydrogen. (The superconductivity of such phthalocyanine based devices at liquid nitrogen temperatures has not been experimentally demonstrated.) A method of manufacturing a composite wire for use in superconducting cables is disclosed in U.S. Pat. No. 3,890,700 issued Jun. 24, 1985 to Diepers et al. The method of Diepers et al comprises cold-drawing a structure comprising a rod-shaped aluminum core and a niobium jacket enclosing the core. The aluminum core/niobium jacket construction is assembled with a drawing aid surrounding the niobium jacket, such as a copper tube. The drawing aid is removed after the cold-drawing operation has produced a solid bond between the niobium and the aluminum. In U.S. Pat. No. 3,781,982 issued Jan. 1, 1974 to Ziemek et al, a superconductor is taught in the form of a tube made from a self-supporting thin sheet with an axial welding seam. Such tube is attached to a separately made carrier, either as an outside envelope or as an inside lining, in either case being in intimate contact therewith. Lead, niobium and some niobium alloys and compounds are disclosed as being known superconductive materials. In the disclosed embodiment of a superconductor layer carried as an inside lining of a carrier pipe, it is taught that the cryogenic fluid can be passed through the interior of the pipe. Yet another design for a cryogenic cable is disclosed in U.S. Pat. No. 3,736,365 issued May 29, 1973 to Bobo et al. The cryogenic cable of Bobo et al is hollow at its core for the passage of cryogenic fluids such as helium. Surrounding the hollow core is an aluminum covering in which are disposed superconductive strands. A metallic thermal screen surrounds the aluminum covering and incorporates axially extending, circumferentially spaced ducts through which also would flow cryogenic fluid. A steel covering surrounds the entire assembly and a thermal insulator separates the thermal screen from the outside steel covering. Variations on this design are disclosed by Bobo et al, all of which are based on a thermal screen with cryogenic fluid-carrying ducts surrounding a central cryogenic fluid-carrying core. In U.S. Pat. No. 3,537,827 issued Jun. 23, 1967 to Benz et al is disclosed a flexible superconductive laminate in which a superconductive layer is bonded between a layer of a non-magnetic, non-superconductive material which has a high yield strength, a relatively high modulus of elasticity and a layer of a non-superconductive material which has a relatively low modulus of elasticity and a relatively low electrical resistance at cryogenic temperatures. The superconductive laminate of Benz et al is said to be more readily formed into coils because of the proportionate thicknesses of the non-superconductive layers. A method of manufacturing a superconductor assembly is disclosed in U.S. Pat. No. 3,514,850 issued Jun. 2, 1970 to Barber et al. In the method of Barber et al at least one ductile superconductor member is positioned in a sheath comprising at least one metal selected from a named group, such as aluminum, silver, etc. The sheath is provided with an exterior formed of a ductile metal which will support the sheath. The assembly is worked to reduce the cross-sectional dimensions of the superconductor member or members, the sheath and the exterior covering. U.S. Pat. No. 3,493,475 issued Feb. 3, 1972 to Neugebauer et al discloses the use of an anodized aluminum mirror substrate as the base for a cryotron. Specifically, it is therein taught to chemically strip the anodic coating of the mirror substrate and then to apply layers of superconducting films and gates sequentially to the stripped surface. The entire structure thereafter can be anodized. Yet another superconductor assembly is disclosed in U.S. Pat. No. 3,327,370 issued Jun. 27, 1967 to Cohen. Specifically, Cohen discloses a process for manufacture of coated superconductive ribbons. The method involves applying to a tin coated ribbon a coating of boron nitride. Boron nitride is suspended in a volatile carrier, e.g. acetone, applied by spraying. According to one embodiment, the niobium, carrying clad tin on one surface, is folded in upon itself such that the niobium sandwiches the tin. The aforesaid boron nitride coating is then applied, the ribbon wound onto a spiral and then heat treated to produce $Nb_3Sn$.

In recent years, new superconductive materials have been developed featuring higher critical temperatures than conventional superconducting substances. That is, materials have been discovered which are superconducting at relatively high temperatures, such as that of liquid nitrogen. The higher the critical temperature, the less costly it is to maintain such critical temperature and, accordingly, the superconducting condition of the material. These materials include various oxide compounds, most notably compounds consisting of rare earths, alkali earths and copper oxide. More generally, the new compounds include, but are not limited to, compounds of the system generally represented by $(L_{1-x}M_x)_aA_bD_y$, as reported by Woo et al in Physical Review Letters 58, No. 9, 908–910 (2 March, 1987). Such so-called "high temperature" superconductors (hereinafter high $T_c$ superconductors) include, for example, Y-Ba-Cu-O ceramic compounds and can be laid down and used in thin film applications including, for example, electronic circuit connector pathways, etc. Such thin film applications, however, require substrates onto which the superconductor can be deposited plus means for maintaining the needed cryogenic temperatures so that the thin film superconductor can be maintained in a superconducting state. Certain uses of the new ceramic superconductors in thin film applications require an assembly providing the needed thermal conditions, electrical isolation and structural support, the ceramic itself making little or no contribution to the stuctural support. It is an object of the present invention to provide such an assembly. Additional objects of the invention will be understood by the skilled of the art in view of the following disclosure.

SUMMARY OF THE INVENTION

According to an assembly aspect of the present invention, a thin film superconductor assembly is provided, which assembly comprises:

a self-supporting substrate, a first surface of which defines at least a portion of a containment for a flow of cryogenic fluid;

a dielectric layer adherent to a second surface of the substrate;

a thin film superconductor adherent to the dielectric layer, the thin film superconductor being substantially electrically isolated from the substrate by the dielectric layer; and a substantially moisture and oxygen impervious, electrically insulating coating covering the thin film superconductor.

According to another aspect of the invention, a method is provided of fabricating a thin film superconductor assembly within the scope of the assembly aspect of the invention disclosed above. Such method of the invention comprises:

providing a self-supporting substrate formed of the material selected from the group consisting of aluminum and aluminum alloys containing at least about 70 weight percent aluminum, a first surface of the substrate being adapted to form at least a portion of a containment for a flow of cryogenic fluid;

growing an aluminum nitride dielectric layer integral with a second surface of the substrate;

providing a thin film superconductor adherent to the surface of the dielectric layer, the dielectric layer substantially electrically isolating the substrate from the thin film superconductor; and coating the thin film superconductor with a substantially moisture and oxygen impervious, electrically insulating material.

According to a particular assembly aspect of the invention, a thin film superconductor assembly is provided which is particularly adapted to be fabricated by the above disclosed method aspect of the invention. Such thin film superconductor assembly comprises:

a self-supporting substrate formed of a material selected from the group consisting of aluminum and aluminum alloys containing at least about 70 weight percent aluminum, a first surface of the substrate defining at least a portion of a containment for a flow of cryogenic fluid;

a dielectric layer of aluminum nitride adherent to a second surface of the substrate;

a thin film superconductor adherent to the dielectric layer opposite the substrate, the dielectric layer being sufficient to substantially electrically isolate the substrate from the thin film superconductor; and a substantially moisture and oxygen impervious, electrically insulating coating covering the thin film superconductor.

Other aspects and features of the invention will be understood from the following detailed disclosure and the appended drawings.

DETAILED DESCRIPTION OF THE INVENTION

Figure 1:
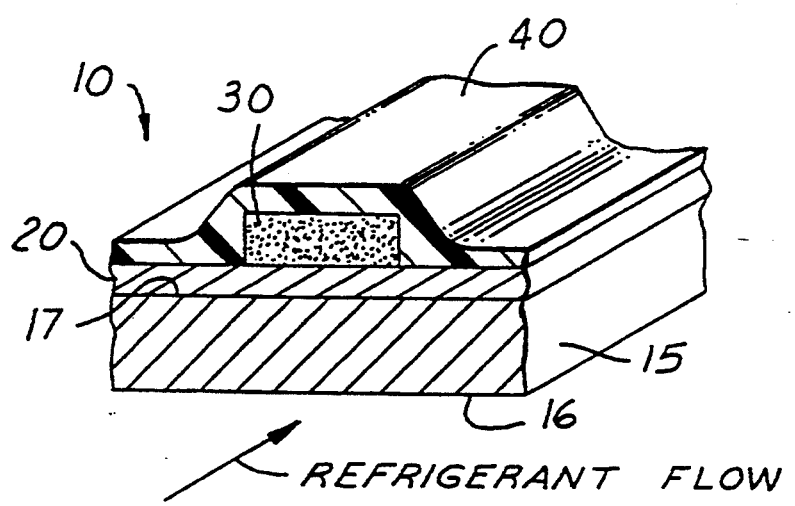
FIG. 1 is a cross-sectional view of a planar type thin film superconductor assembly according to a preferred embodiment of the invention.

Referring to FIG. 1, a thin film superconductor assembly 10 according to a preferred embodiment of the invention is seen to be of a planar type, comprising a self-supporting substrate 15 having a lower surface 16 and an upper surface 17. The assembly further comprises a dielectric layer 20, a thin film superconductor 30 and a substantially moisture and oxygen impervious, electrically insulating coating 40. Such assembly is described now in greater detail.

The substrate 15 forms at least a portion of a containment for a flow of cryogenic fluid to maintain the assembly at sufficiently low temperatures to operate as a superconductor. More specifically, lower surface 16 of substrate 15 forms at least a portion of the inside surface of a chamber, conduit, etc. carrying cryogenic fluid. Thus, surface 16 would be in contact with such cryogenic fluid and heat would be extracted from the assembly through surface 16 to the cryogenic fluid acting as a heat sink. The substrate 15 can be formed of any material or combination of materials which produce a self-supporting component with sufficiently high thermal conductivity (given the substrate thickness and other dimensions required to make the substrate self-supporting) to evacuate sufficient heat from the assembly during operation in its expected environment to maintain the superconducting material, described below, at the necessary cryogenic temperatures. Preferably, the substrate comprises metal, more preferably a very high thermally conductive metal such as aluminum and aluminum alloys comprising at least about 70 weight percent aluminum by weight. The substrate must also be of a material suitable to form an adherent bond with the dielectric layer 20.

Dielectric layer 20 is laid down on surface 17 of the substrate to electrically insulate the thin film superconductor 30 from the substrate 15. The dielectric layer 20 can be formed of any suitable dielectric material which can achieve good structural integrity with substrate 15 and with superconductor 30 and coating 40. Preferred materials include various commercially available ceramic and ceramic-like materials well known to the skilled of the art. Exemplary such materials include beryllium oxide, diamond or diamond-like thin films, silicon carbide, strontium titanate, aluminum oxide and aluminum nitride. Other suitable dielectric layer materials will be apparent to the skilled in the art in view of the present disclosure. It will be within the skill of the art to select particular material(s) for the dielectric layer and to provide same in a suitable thickness in view of the intended use and environment of use for the superconductor assembly. Specifically, the dielectric layer must be provided in sufficient thickness to electrically insulate the thin film superconductor from the substrate and must not be so thick that it impedes extraction of heat through the substrate to the cryogenic fluid. In this light, it will be understood that it is not essential that the dielectric layer and thin film superconductor be carried on a surface of the substrate directly opposite that surface of the substrate which is in contact with the cryogenic fluid. It is necessary only that the two be sufficiently proximate to achieve adequate heat extraction from the superconductor to the cryogenic fluid to maintain the necessary cryogenic temperatures for superconductivity.

Aluminum nitride is especially preferred for the dielectric layer in view of its high dielectric constant and its superb thermal conductivity and for reasons concerning the method aspect of the invention described below. A diamond or diamond-like dielectric layer can be grown according to methods known to the skilled of the art and is a preferred material in view of its superb thermal conductivity and excellent dielectric value. Achieving good integration with the substrate may, however, in some cases, be more difficult than with others of the materials mentioned. In addition, present methods of growing diamond layers on substrates require temperatures that exceed the melting point of aluminum. Accordingly, a substrate other than aluminum must be chosen having a sufficiently high melting point where a diamond or diamond-like dielectric layer is to be grown on the surface of the substrate. Strontium titanate, especially single crystal strontium titanate has been found to be particularly suitable for contact with the high $T_c$ ceramic superconductor materials mentioned above and will for that reason, in certain embodiments of the present invention, be a preferred material for the dielectric layer 20 of the superconductor assembly. It is generally recognized by those skilled in the art, however, that strontium titanate and like materials can be quite difficult to grow on polycrystaline metals such as aluminum.

The thin film superconductor 30 is laid down on the surface of the dielectric layer according to any of various methods known to the skilled of the art. Such method will depend, of course, on the superconductor material selected for use. The high $T_c$ ceramic superconductors mentioned above are preferred for use in the invention in view of their suitability for thin film applications. It presently is believed that especially good superconductivity would be achieved by growing a single crystal thin film superconductor on the dielectric layer. A single crystal thin film superconductor is not, however, essential to the invention and may not be commercially competitive with non-single crystal thin film superconductors in view of the difficulty and cost currently associated with the growing of single crystal superconductors.

Thin film superconductors of Y-Ba-Cu-O and Er-Ba-Cu-O-systems of oxygen defect perovskite can be prepared for the present invention by sputtering deposition, for example, according to the techniques disclosed by Kitabatake et al, *Superconducting Y-Ba-Cu-O and Er-Ba-Cu-O Thin Films Prepared by Sputtering Deposition,* presented at the 34th National Symposium of the American Vacuum Society, the disclosure of which is incorporated herein by reference. One such high $T_c$ superconductive thin film was so grown without post annealing. Other methods for vapor deposition of thin film high $T_c$ superconductors suitable for the present invention are disclosed by Laibowitz, *Vapor Deposited Superconducting Oxide Thin Films,* and by Hong et al, *Thin Film Research of High $T_c$ Superconductors,* both also given at the 34th National Symposium of the American Vacuum Society and both also incorporated herein by reference.

Coating 40 acts as a moisture and oxygen barrier and serves also to electrically isolate the thin film superconductor, this latter function being performed in conjunction with the dielectric layer. The coating can be formed of any of numerous materials, the identity and suitability of which will be apparent to the skilled of the art in view of the present disclosure. The material preferably is one which can be applied as a liquid and must, in any event, achieve good adhesion to the thin film superconductor and to the dielectric layer where the two are to have an interface. The coating 40 must be applied in sufficient thickness to provide the necessary protection and insulation given the environment in which the superconductor assembly is to be used, its desired life expectancy, etc. The protective coating 40 is particularly important for use with the high $T_c$ ceramic superconductors mentioned above, especially the yttrium-barium-copper-oxygen superconductors in view of the sensitivity of such superconductor materials to contact with other materials. Coating 40 can be, for example, a physically or chemically vapor deposited film or a polymeric material applied typically by various known theological processes such as spin coating. Preferred polymeric materials for the protective coating 40 include polyimides and the like. Numerous additional commercially available materials suitable for use as the protective coating 40 will be apparent to those skilled in the art in view of the present disclosure.

Figure 2:
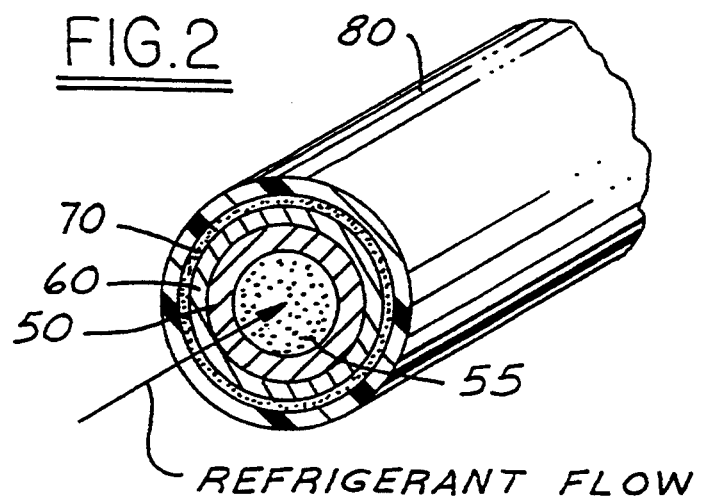
FIG. 2 is a cross-sectional view of a preferred tubular embodiment of the thin film superconductor assembly of the invention.

Referring now to FIG. 2, a tubular embodiment of the invention is seen to comprise a substrate 50 which is self-supporting and, as in the case of the planar embodiment discussed above, is structurally sufficient to support the entire superconductor assembly. Substrate 50 is seen to be a hollow cylinder, passage 55 of which is adapted to carry a flow of cryogenic fluid for cooling the superconductor assembly. Dielectric layer 60 is carried on the outside surface of substrate 50 and the thin film superconductor 70 is formed as a cylindrical layer carried on the outside of the dielectric layer 60. Finally, the protective coating 80 forms the exterior surface of the assembly.

A preferred embodiment of the thin film superconductor assembly of the invention is fabricated according to the method aspect of the invention. According to such method, the self-supporting substrate is formed of a material selected from the group consisting of aluminum and aluminum alloys containing at least about 70 weight percent aluminum, more preferably at least about 85 weight percent. The dielectric layer is provided by growing an aluminum nitride dielectric layer integral with the surface of the aluminum or aluminum metal substrate. Thus, the superb thermal conductivity and the high dielectric constant of aluminum nitride is achieved together with the excellent structural integrity of a dielectric layer which is integral with the substrate.

The aluminum nitride layer can be grown on the substrate by any of various methods known to the skilled of the art including, for example, vapor deposition. According to preferred embodiments of this method aspect of the invention, however, the aluminum nitride dielectric layer is grown by nitriding the aluminum-bearing substrate. A critical aspect of this preferred embodiment of the invention is that the substrate is the source of the aluminum in the aluminum nitride layer. In U.S. Pat. No. 4,522,660 to Suzuki a process is disclosed for ion nitriding of aluminum using a glow discharge technique, which disclosure is incorporated herein by reference. The glow discharge process of Suzuki is a relatively low energy process and improved adhesion of the aluminum nitride layer to the aluminum-bearing substrate has been achieved using higher energy ion beam implanting methods known generally to the skilled of the art. Aluminum nitride layers produced by such higher energy processes may, however, provide a layer of somewhat lower dielectric constant. It will be within the ability of those skilled in the art to select nitriding processes and techniques providing aluminum nitride dielectric layers having both adequate adhesion and dielectric properties. Teachings regarding the growing of AlN by nitriding of aluminum also are disclosed in Nippon Kogyo Shimbun (Japan Daily Industrial Newsletter) 12/85, p.5, and in Techno Japan 19 (3), 76 (1986), which disclosures are incorporated herein by reference.

While not intending to be bound by theory, it is here mentioned for completeness of explanation that an aluminum nitroxy ($AlN_xO_y$) interfacial layer may be produced during a nitriding process between the aluminum nitride layer and the aluminum bearing substrate. Such aluminum nitroxy may be formed at the outer surface of the dielectric layer and/or be dispersed in some measure throughout the layer. This does not, in any event, change the essential feature of this preferred embodiment of the invention, i.e., that the aluminum nitride layer is integral with the substrate and that the aluminum bearing substrate is the source of the aluminum in the aluminum nitride layer.

Further regarding the method aspect of the invention, a thin film superconductor is provided adherent to the surface of the dielectric layer (i.e., adherent to the surface of the aluminum nitride opposite the substrate). As discussed above, the dielectric layer must be sufficient to substantially electrically isolate the substrate from the thin film superconductor. This is especially important according to this aspect of the invention in view of the high electrical conductivity of aluminum and aluminum alloy materials used as the substrate. Depending upon the superconductor material chosen for the thin film superconductor, it may be necessary to employ an interfacial layer between the superconductor and the dielectric layer to improve adhesion and/or to prevent interaction of the superconductor material with the dielectric layer either during the fabrication process or during use of the superconductor assembly. It will be within the ability of those skilled in the art, in view of the present disclosure, to provide such interfacial layer as needed.

It will be preferred according to certain embodiments of the invention to provide surface treatment of the aluminum nitride layer to remove contaminants prior to laying down the superconductor layer. This will be especially significant where the superconductor material selected for the thin film superconductor is particularly susceptible to performance deterioration due to contamination. It also will be significant where the process of making the thin film superconductor on the surface of the dielectric layer is particular sensitive to contamination. One suitable interfacial layer for this purpose, for example, is strontium titanate.

Certain of the above-mentioned high $T_c$ superconductor materials, most notably $Y_lBa_2Cu_3O_{7-x}$ (where x is a small number) and the like may require relatively high temperature processing. More specifically, a high temperature (generally approximately 800°) treatment step may be needed for post-annealing or "perfection" of the superconductor. Thus, for example, the component materials can be formed initially as a slurry and then heat treated in air or in oxygen bearing atmosphere to produce the desired superconductor material. It will be apparent, therefore, that where a superconductor material of this type is employed, the aluminum or aluminum alloy must be protected against such heat. Thus, for example, techniques for heating the thin film of pre-superconductor slurry, for example high speed laser heating techniques, can be used to substantially isolate the heat to the pre-superconductor slurry. High speed heat processing according to such techniques also would minimize reaction of the slurry with the dielectric layer and any other adjacent materials and contaminants. Additional alternatives include the above-mentioned, recently developed techniques, such as sputtering techniques, for growing a thin film high $T_c$ superconductor which can be perfected without (or with little) high temperature processing, perhaps in conjunction with ion implantation of excess oxygen. It will be apparent in view of the present disclosure that such processing techniques can be used in the present invention to form the thin film superconductor on the surface of-the dielectric layer. Of course, it will be understood that alternative superconductor materials not requiring such high temperature processing can be employed in the invention. It also will be apparent that very complex circuitry paths can be achieved by many of the above-discussed methods, including painting the aforesaid pre-superconductor slurry onto the dielectric layer according to any desired pattern and configuration.

Various modifications and additions to the invention as disclosed above will be apparent to those skilled in the art in view of the present disclosure, such modifications and additions being within the scope of the claims appended hereto.

I claim:

1. A method of fabricating a thin film superconductor assembly, said method comprising:
    providing a self-supporting substrate formed of the material selected from the group consisting of aluminum and aluminum alloys containing at least about 70 weight percent aluminum, a first surface of said substrate adapted to form at least a portion of a containment for a flow cryogenic fluid;
    growing an aluminum nitride dielectric layer integral with a second surface of said substrate;
    providing a thin film superconductor adherent to a surface of said dielectric layer, said dielectric layer substantially electrically isolating said substrate from said thin film superconductor; and
    coating said thin film superconductor with a substantially moisture and oxygen impervious, electrically nonconductive material.

2. The method of claim 1, wherein said dielectric-layer is grown by vapor deposition on the surface of said substrate.

3. The method of claim 1, wherein said dielectric layer is grown by nitriding said substrate, wherein aluminum of said substrate is incorporated to form said aluminum nitride.

4. The method of claim 3, wherein said dielectric layer is grown by ion beam implantation of nitrogen.

5. The method of claim 1, wherein said thin film superconductor consists essentially of ceramic.

6. The method of claim 1, wherein said thin film superconductor consists essentially of a compound of yttrium, barium, copper and oxygen.

7. The method of claim 1, wherein said coating consists essentially of polymeric material.

8. The method of claim 1, wherein said coating is polyimide.

9. The method of claim 1, wherein said assembly is tubular, said containment defined by said substrate being a tubular passage for said flow of cryogenic fluid extending longitudinally through the center of said assembly, and said coating forming an exterior surface of said assembly.

10. The method of fabricating a thin film superconductor assembly according to claim 1, further comprising providing an interfacial layer between said thin film superconductor and said dielectric layer.

* * * * *